US008775106B2

(12) United States Patent  
Zenati et al.

(10) Patent No.: US 8,775,106 B2  
(45) Date of Patent: Jul. 8, 2014

(54) METHOD FOR DETERMINING A PARAMETER OF AT LEAST ONE ACCUMULATOR OF A BATTERY

(75) Inventors: Ali Zenati, Bordeaux (FR); Philippe Desprez, Bordeaux (FR); Gerard Barrailh, Gradignan (FR); Hubert Razik, Meyzieu (FR); Stephane Rael, Nancy (FR)

(73) Assignee: Universite dé Lorraine, Nancy Cedex (FR)

( * ) Notice: Subject to any disclaimer, the term of this patent is extended or adjusted under 35 U.S.C. 154(b) by 351 days.

(21) Appl. No.: 13/186,077

(22) Filed: Jul. 19, 2011

(65) Prior Publication Data

US 2012/0022816 A1   Jan. 26, 2012

(30) Foreign Application Priority Data

Jul. 23, 2010   (FR) ..................................... 10 56036

(51) Int. Cl.  
*G01R 31/36*   (2006.01)

(52) U.S. Cl.  
USPC ................... 702/63; 702/58; 702/64; 702/79; 702/108

(58) Field of Classification Search  
USPC .......... 702/58, 63, 64, 79, 108; 324/426–434; 320/132, 134–136  
See application file for complete search history.

(56) References Cited

U.S. PATENT DOCUMENTS

| 5,991,707 | A   | 11/1999 | Searles et al. |
| 6,616,715 | B2* | 9/2003  | Kitoh et al. ................. 29/623.1 |
| 8,340,934 | B2* | 12/2012 | Xu et al. ........................ 702/63 |

FOREIGN PATENT DOCUMENTS

| EP | 1 632 782 A1 | 3/2006 |
| FR | 2 920 884 A1 | 3/2009 |
| FR | 2 941 054 A1 | 7/2010 |

OTHER PUBLICATIONS

European Search report issued Sep. 28, 2011 for corresponding European Patent Application No. 11174441.

* cited by examiner

*Primary Examiner* — Elias Desta  
(74) *Attorney, Agent, or Firm* — Sughrue Mion, PLLC

(57) ABSTRACT

A method for determining a parameter such as the resistance of at least one accumulator of a battery. The method includes the following steps: measuring a first voltage (U1) when the current is substantially equal to a predetermined value; conducting the plurality of voltage and current measurements (Un; In) during a current pulse; calculating a plurality of resistance values (Rn) from the first voltage and from the plurality of voltage and current measurements; determining a resistance value as the average of the calculated resistance values and an associated standard deviation; determining an absolute uncertainty on the value of the resistance as the product of the standard deviation and of a Student coefficient; if the relative uncertainty is less than or equal to a predetermined accuracy threshold, validating the resistance value (R).

22 Claims, 11 Drawing Sheets

Figure 11

| P | 20% | 50% | 68% | 90% | 95% | 95.50% | 98% | 99% | 99.70% |
|---|---|---|---|---|---|---|---|---|---|
| p | 0.8 | 0.5 | 0.32 | 0.1 | 0.05 | 0.045 | 0.02 | 0.01 | 0.003 |
| $v=n-1$ | | | | | | | | | |
| 1 | 0.325 | 1.000 | 1.819 | 6.314 | 12.706 | 14.124 | 31.821 | 63.657 | 212.205 |
| 2 | 0.289 | 0.816 | 1.312 | 2.920 | 4.303 | 4.583 | 6.965 | 9.925 | 18.216 |
| 3 | 0.277 | 0.765 | 1.189 | 2.353 | 3.182 | 3.322 | 4.541 | 5.841 | 8.891 |
| 4 | 0.271 | 0.741 | 1.134 | 2.132 | 2.776 | 2.880 | 3.747 | 4.604 | 6.435 |
| 5 | 0.267 | 0.727 | 1.104 | 2.015 | 2.571 | 2.658 | 3.365 | 4.032 | 5.376 |
| 6 | 0.265 | 0.718 | 1.084 | 1.943 | 2.447 | 2.525 | 3.143 | 3.707 | 4.800 |
| 7 | 0.263 | 0.711 | 1.070 | 1.895 | 2.365 | 2.436 | 2.998 | 3.499 | 4.442 |
| 8 | 0.262 | 0.706 | 1.060 | 1.860 | 2.306 | 2.373 | 2.896 | 3.355 | 4.199 |
| 9 | 0.261 | 0.703 | 1.053 | 1.833 | 2.262 | 2.327 | 2.821 | 3.250 | 4.024 |
| 10 | 0.260 | 0.700 | 1.046 | 1.812 | 2.228 | 2.290 | 2.764 | 3.169 | 3.892 |
| 11 | 0.260 | 0.697 | 1.041 | 1.796 | 2.201 | 2.261 | 2.718 | 3.106 | 3.789 |
| 12 | 0.259 | 0.695 | 1.037 | 1.782 | 2.179 | 2.237 | 2.681 | 3.055 | 3.706 |
| 13 | 0.259 | 0.694 | 1.034 | 1.771 | 2.160 | 2.218 | 2.650 | 3.012 | 3.639 |
| 14 | 0.258 | 0.692 | 1.031 | 1.761 | 2.145 | 2.201 | 2.624 | 2.977 | 3.583 |
| 15 | 0.258 | 0.691 | 1.029 | 1.753 | 2.131 | 2.187 | 2.602 | 2.947 | 3.535 |
| 16 | 0.258 | 0.690 | 1.026 | 1.746 | 2.120 | 2.175 | 2.583 | 2.921 | 3.494 |
| 17 | 0.257 | 0.689 | 1.024 | 1.740 | 2.110 | 2.164 | 2.567 | 2.898 | 3.459 |
| 18 | 0.257 | 0.688 | 1.023 | 1.734 | 2.101 | 2.154 | 2.552 | 2.878 | 3.428 |
| 19 | 0.257 | 0.688 | 1.021 | 1.729 | 2.093 | 2.146 | 2.539 | 2.861 | 3.401 |
| 20 | 0.257 | 0.687 | 1.020 | 1.725 | 2.086 | 2.139 | 2.528 | 2.845 | 3.376 |
| 30 | 0.256 | 0.683 | 1.011 | 1.697 | 2.042 | 2.092 | 2.457 | 2.750 | 3.230 |
| 40 | 0.255 | 0.681 | 1.007 | 1.684 | 2.021 | 2.070 | 2.423 | 2.704 | 3.160 |
| 60 | 0.254 | 0.679 | 1.003 | 1.671 | 2.000 | 2.047 | 2.390 | 2.660 | 3.094 |
| 100 | 0.254 | 0.677 | 0.999 | 1.660 | 1.984 | 2.030 | 2.364 | 2.626 | 3.042 |
| 150 | 0.254 | 0.676 | 0.998 | 1.655 | 1.976 | 2.022 | 2.351 | 2.609 | 3.017 |
| ∞ | 0.253 | 0.674 | 0.994 | 1.645 | 1.960 | 2.005 | 2.326 | 2.576 | 2.968 |

METHOD FOR DETERMINING A PARAMETER OF AT LEAST ONE ACCUMULATOR OF A BATTERY

BACKGROUND OF THE INVENTION

1. Field of the Invention

The present invention relates to a method for determining a parameter, such as the resistance, the state of charge or the capacity, of at least one accumulator of a battery, notably in order to determine the state of health of the battery; as well as to an electronic system for monitoring a battery.

2. Background

Typically a battery comprises a plurality of accumulators also called electrochemical generators, cells or elements. An accumulator is a device for producing electricity in which chemical energy is converted into electrical energy. The chemical energy is formed by electrochemically active compounds deposited on at least one face of electrodes positioned in the accumulator. Electrical energy is produced by electrochemical reactions during discharge of the accumulator. The electrodes, positioned in a container are electrically connected to current output terminals which ensure electrical continuity between the electrodes and an electricity consuming device with which the accumulator is associated.

A battery may be divided into modules, each module consisting of a plurality of accumulators connected together in series and/or in parallel. The battery is intended to provide electrical energy to an outer application. A charging circuit is generally provided to which the battery may be connected for recharging the accumulators. The battery may include one or more parallel branches of accumulators connected in series and/or one or more parallel branches of modules connected in series. A management system comprising measurement sensors and an electronic control circuit, which is more or less sophisticated depending on the applications, may be associated with the battery.

The state of charge (SOC) and the state of health (SOH) are pieces of information useful for the electronic management system of the battery in order to optimize its use and its lifetime.

Typically, the state of charge SOC is determined as the amount of energy available in the battery, relatively to the energy of a totally charged battery. The state of charge SOC may be calculated for example according to an algorithm using voltage measurements or integration of the charging/discharging current over time depending on the current conditions of the battery.

The state of health SOH of the battery allows an estimation of the ageing of the battery between a new state and an end-of-life state.

A first method for determining the SOH of a battery, a so-called static method, consists of monitoring the values of temperature, of voltage and optionally of current of the battery in order to determine an SOH value from ageing laws. These ageing laws are obtained from tests conducted in a laboratory. An SOH algorithm then gives an estimation of the ageing of the battery. However this method for determining the SOH of the battery is subject to the assumption of homogeneous ageing of the accumulators of the battery. The method for determining the SOH by a predictive model also assumes a flawless power circuit between the accumulators.

A second method for determining the SOH of a battery, a so-called dynamic method, consists of calculating the ratio of the resistance of the battery at a given instant over the resistance of the battery in the new condition under the same measurement conditions. The SOH may also be calculated from the ratio of the capacity of the battery at a given instant over the capacity of the battery in the new condition. Depending on the size of the battery and/or depending on the applications, a calculation of SOH may be provided for the battery as a whole or for each module or for each accumulator.

Typically, the resistance of a battery (or of an accumulator of the battery) is measured according to a voltage drop over only two points, while considering a relative uncertainty related to the measurement determined by a conventional uncertainty calculation method.

FIG. 1 illustrates ideal simulated current and voltage signals of a battery during a current pulse. A determination of the resistance may be carried out during such a pulse: a first voltage measurement U1 is conducted when the current is 0, the voltage then being 3.944 V; and a second voltage measurement U2 is conducted during the pulse with a current of −60 A, the voltage being 3.864 V. A resistance value R is then obtained, determined as follows:

$$R = \Delta V / \Delta I = 1.33 \text{ m}\Omega$$

However, in reality, whether the pulse is caused during a maintenance cycle or on an onboard application, the ideal signals illustrated in FIG. 1 do not exist but have perturbations which take into account inter alia the uncertainties of the voltage and current sensors. FIG. 2 illustrates noisy simulated current and voltage signals of a battery during a current pulse. Typically, the current sensor has a 5% ripple in the low portion of the pulse and the voltage sensor has a ripple related to the uncertainty of 20 mV. Thus, with a relative uncertainty of 5% on the current and an absolute uncertainty of 20 mV on the voltage, the relative uncertainty on the resistance measurement is calculated as follows by using a conventional method for calculating uncertainties:

$$dR/R = d\Delta V/\Delta V + d\Delta I/\Delta I = dU1/\Delta V + dU2/\Delta V + dI1/\Delta I + dI2/\Delta I,$$

i.e. an uncertainty of 60%.

Also, if the uncertainty is calculated by using the method of quadratic sums:

$$dR/R = \sqrt{(d\Delta V/\Delta V)^2 + (d\Delta V/\Delta I)^2},$$

an uncertainty value of 51% is obtained which remains far from a reliable value.

Moreover, the resistance measurement requires a current pulse in order to cause a voltage drop allowing the measurement of two pairs of voltage and current values. For this purpose, the resistance of the battery (or of an accumulator of the battery) is generally measured during a maintenance operation; for example upon checking the connection of the battery.

When the battery is connected to an application, it is possible to estimate the state of health by means of predictive models. For example, document FR-A-2 920 884 describes a method for estimating the state of health of a battery onboard an automobile. This method detects a stable state of the battery and generates a current at its terminals in order to estimate the value of the internal resistance from changes in current and voltage. The value of the internal resistance is then related to an estimation of the state of health of the battery by means of mapping.

Document WO-A-2007/004817 proposes determination of the internal resistance of the battery from measurements of temperature and from estimations of the state of charge; an instantaneous resistance is measured from a pair of voltage-current values and then normalized. The value of the internal resistance is then related to an estimation of the state of health of the battery by means of a table.

Document US-A-2009/0140744 proposes determination of a pseudo-impedance of the battery from discharge pulses imposed to the battery. The state of health of the battery is then determined from this pseudo-impedance.

Document US-A-2009/0085517 describes a method for managing the charging of a battery in a portable appliance which uses a statistical method for comparing the value of the remaining capacity with the initial value.

Methods known for determining the resistance of a battery (or of an accumulator of a battery) use estimations and/or direct measurements accompanied by significant uncertainty. The subsequent determination of the state of health of the battery is strongly affected by this.

Therefore, there exists a need for a method for determining the resistance of at least one accumulator of a battery which has reduced and known uncertainty in order to increase the confidence related to the resistance value and therefore to the subsequent determination of a state of health. There also exists a need for a method for determining the resistance of at least one accumulator of a battery which may be applied independently when the battery is being used or in maintenance.

Moreover, as indicated above, the state of health may be determined from the capacity of at least one accumulator of the battery.

In a way known per se, the capacity of an accumulator may be calculated from values of the state of charge at different instants, notably for accumulators of the Li-ion type which have a direct relationship between the SOC and the no-load voltage. FIG. 12 shows such a curve of the state of charge versus the no-load voltage for a Li-ion accumulator.

The capacity of an accumulator is expressed in Ah by the following relationship:

$$C = \frac{\int_{t_{initial}}^{t_{final}} I dt / 3600}{SOC(t_{final}) - SOC(t_{initial})}$$

The determination of the SOC values at two relevant instants (initial and final instants in the formula above) requires a measurement of current and voltage at these instants. Like for determining the resistance, the uncertainty on the measurement of current and of voltage entails uncertainty on the SOC values and therefore on the value of the capacity. Known methods for determining the capacity of a battery (or of an accumulator of a battery) use estimations and/or direct measurements accompanied by significant uncertainty. The subsequent determination of the state of health of the battery is strongly affected by this.

Therefore, there also exists a need for a method for determining the capacity of at least one accumulator of a battery which has a reduced and known uncertainty in order to increase confidence related to the capacity value and therefore to the subsequent determination of a state of health.

SUMMARY OF THE INVENTION

For this purpose, the invention proposes determination of the resistance or of the capacity of at least one accumulator of the battery from a statistical calculation which also provides the accuracy on this measurement. The measurement uncertainty may thus be considerably reduced and the final measurement may be validated for a reliable determination of the state of the health of the battery.

More particularly, the invention proposes a method for determining a parameter of at least one accumulator of a battery, the method comprising the steps:
  conducting a series of voltage and current measurements on the terminals of said at least one accumulator;
  computing a plurality of values of the parameter depending on the voltage and current measurements;
  determining a value of the parameter as the average of the calculated values of the parameter and an associated standard deviation;
  determining an absolute uncertainty on the value of the parameter as the product of the standard deviation and of a Student coefficient related to the number of calculated values of the parameter and to a selected probability;
  determining a relative uncertainty on the value of the parameter;
  if the relative uncertainty is less than or equal to a predetermined accuracy threshold, validating the value of the parameter.

According to a first embodiment, the parameter is a resistance of at least one accumulator of a battery and the method comprises the steps:
  measuring a current delivered by said at least one accumulator;
  measuring a first voltage on the terminals of said at least one accumulator when the current is substantially equal to a predetermined value;
  detecting a current pulse;
  conducting the plurality of voltage and current measurements on said at least one accumulator during said pulse;
  calculating a plurality of resistance values of said at least one accumulator from the first voltage and from the plurality of voltage and current measurements;
  determining a resistance value as the average of the calculated resistance values and an associated standard deviation;
  determining an absolute uncertainty on the value of the resistance as the product of the standard deviation and of a Student coefficient related to the number of calculated resistance values and to a selected probability;
  determining a relative uncertainty on the value of the resistance;
  if the relative uncertainty is less than or equal to a predetermined accuracy threshold, validating the resistance value of said at least one accumulator.

According to one embodiment, the detection of a current pulse comprises the steps:
  determining a first time interval between a current value equal to the predetermined value and a value of the pulsed current;
  determining a second time interval during which the current corresponds to the pulse current;
  if the first time interval is less than a first threshold and if the second time interval is greater than a second threshold, conducting voltage and current measurements.

According to an embodiment, the detection of a current pulse further comprises a step consisting of determining whether the pulse current remains in a stability interval during the second time interval.

According to an embodiment, the first time threshold, the second time threshold and the current threshold are adjusted depending on the temperature of the battery.

According to an embodiment, the predetermined value of the current for conducting the first voltage measurement is substantially equal to zero.

According to another embodiment, the parameter is a value of the state of charge of at least one accumulator of a battery and the method comprises the steps:
 conducting the plurality of voltage and current measurements on the terminals of said at least one accumulator when the current is substantially equal to a predetermined value;
 calculating a plurality of state-of-charge values from the plurality of voltage and current measurements;
 determining a state-of-charge value such as the average of the plurality of the calculated state-of-charge values and an associated standard deviation;
 determining an absolute uncertainty on the state-of-charge value as the product of the standard deviation and of a Student coefficient related to the number of calculated state-of-charge values and to a selected probability;
 determining a relative uncertainty on the state-of-charge value;
 if the relative uncertainty is less than or equal to a predetermined accuracy threshold, validating the state-of-charge value.

According to an embodiment, the method further comprises the steps:
 determining a first state-of-charge value for a first plurality of voltage and current measurements on the terminals of said at least one accumulator;
 determining a second state-of-charge value for a second plurality of voltage and current measurements on the terminals of said at least one accumulator;
 calculating the capacity of said at least one accumulator from the first and second state-of-charge values as:

$$C = \frac{\int_{t1}^{t2} I dt / 3600}{SOC2 - SOC1}$$

According to another embodiment, the parameter is a capacity value of at least one accumulator of a battery and the method comprises the steps:
 determining a first state-of-charge value of said at least one accumulator;
 conducting the plurality of voltage and current measurements on the terminals of said at least one accumulator;
 calculating a plurality of second state-of-charge values from the plurality of voltage and current measurements:
 calculating a plurality of capacity values from the first and second state-of-charge values as:

$$C_n = \frac{\int_{t1}^{t2} I dt / 3600}{SOC2_n - SOC1};$$

determining a capacity value as the average of the calculated capacity values and an associated standard deviation;
 determining an absolute uncertainty of the value of the capacity as the product of the standard deviation and of a Student coefficient related to the number of calculated capacity values and to a selected probability;
 determining a relative uncertainty on the value of the capacity;
 if the relative uncertainty is less than or equal to a predetermined accuracy threshold, validating the capacity value of said at least one accumulator.

According to an embodiment, the second state-of-charge value(s) is(are) used for calculating the capacity when they differ by at least 10% from the first state-of-charge value.

According to an embodiment, the Student coefficient is selected for a probability of 99.7%.

According to an embodiment, the accuracy threshold is less than or equal to 10%, for example the accuracy threshold is 5%.

According to an embodiment, the battery comprises a plurality of accumulators connected in series and/or in parallel and the parameter is determined for each accumulator of the battery, the plurality of voltage and current measurements being conducted on the terminals of each accumulator.

According to another embodiment, the battery comprises a plurality of modules connected in series and/or in parallel, each module comprising a plurality of accumulators, and the parameter is determined for each module of the battery, the plurality of voltage and current measurements being conducted on the terminals of each module.

According to another embodiment, the parameter is determined for the battery, the plurality of voltage and current measurements being conducted on the terminals of the battery.

The invention also relates to a method for determining the state of health of at least one accumulator of a battery, comprising the steps:
 determining a resistance value according to the method of the invention or a capacity value according to the method of the invention;
 normalizing the determined resistance or capacity value;
 determining the state of health of said at least one accumulator of the battery as the ratio of the normalized determined resistance or capacity over the resistance or the capacity of said at least one accumulator in the brand-new condition.

According to an embodiment, the determined resistance or the determined capacity is normalized at 25° C. and at a current corresponding to the discharge conditions.

The invention further relates to an electronic management system for a battery comprising:
 means for measuring a current delivered by at least one accumulator of the battery;
 means for measuring the voltage on the terminals of said at least one accumulator;
 a microprocessor comprising program means for carrying out the steps of the method for determining a parameter according to the invention and/or the steps of the method for determining the state of health according to the invention.

The invention further relates to a battery comprising a plurality of electrochemical accumulators arranged in modules and/or connected in series and/or in parallel and at least one electronic management system according to the invention.

BRIEF DESCRIPTION OF THE INVENTION

Other features and advantages of the invention will become apparent upon reading the description which follows, given as an example and with reference to the figures wherein:
 FIG. 1, already described, shows graphs of ideal simulated current and voltage signals of a battery during a current pulse;
 FIG. 2, already described, shows graphs of simulated noisy current and voltage signals of a battery during a current pulse;
 FIG. 3 shows a flow chart of the method for determining the SOH according to a first embodiment of the invention;

FIG. 11 shows a table of the Student coefficients for different probabilities and different sample sizes;

Figure 12:
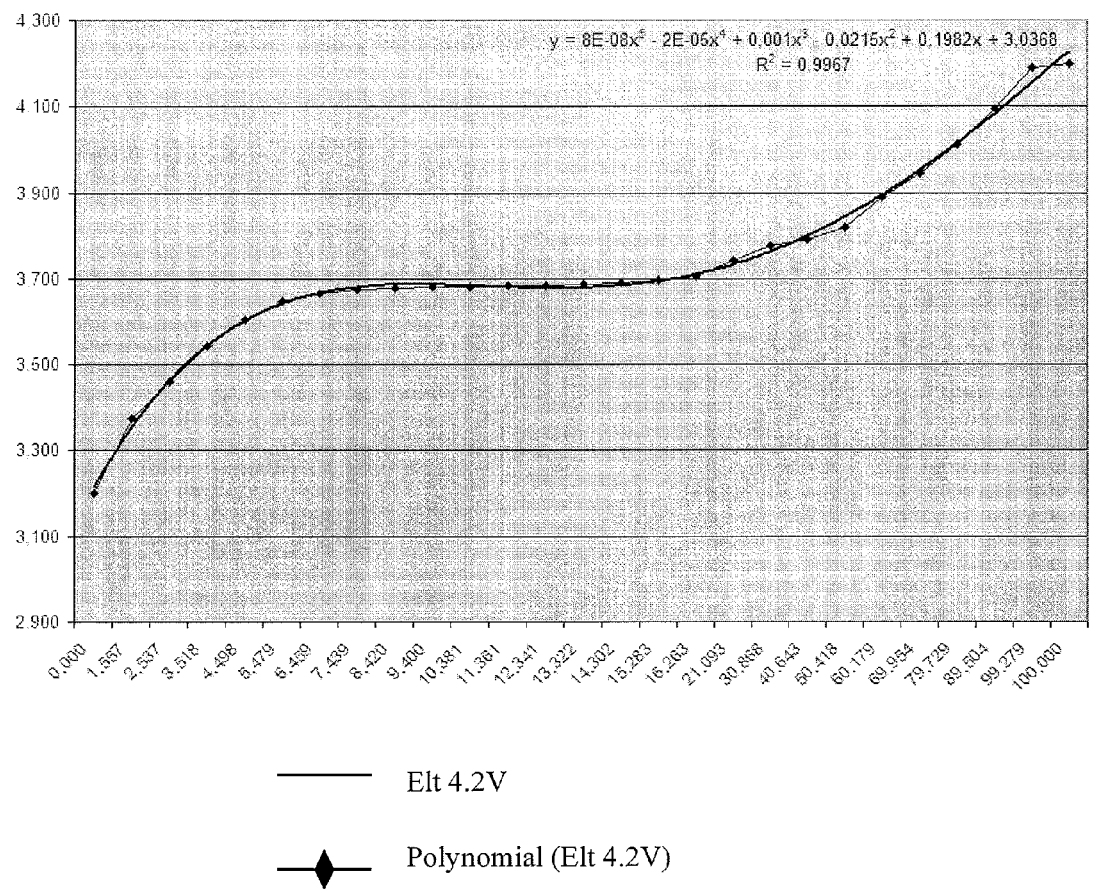
Figure 13:
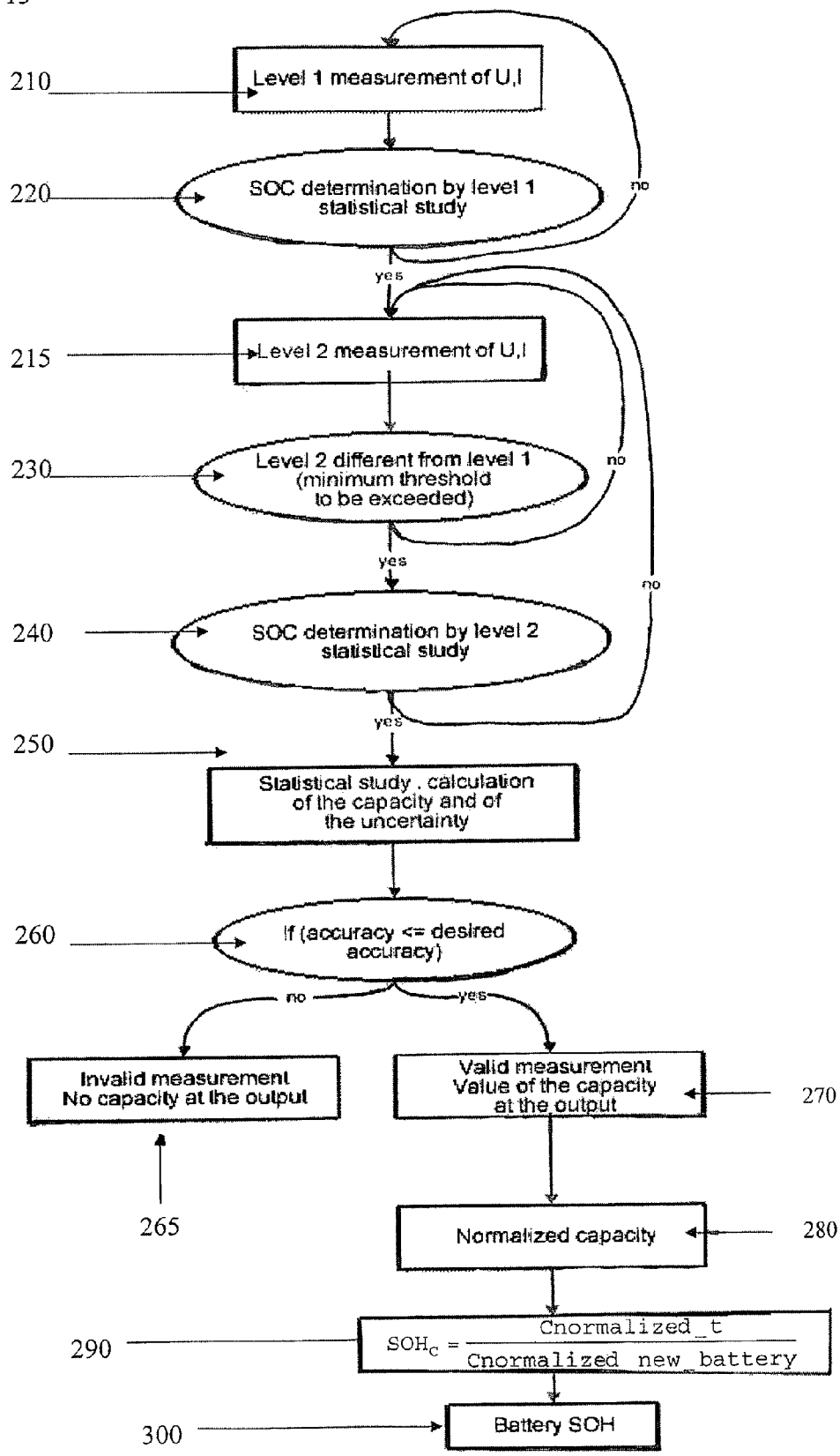

FIG. 12, already described, shows a curve of the state of charge versus the no-load voltage for a Li-ion accumulator;

FIG. 13 shows a flow chart of the method for determining the SOH according to a second embodiment of the invention.

DETAILED DESCRIPTION OF THE INVENTION

The invention relates to a method for determining a parameter of at least one accumulator of a battery with reduced and known uncertainty. The value of the parameter is determined statistically over a population of calculated values from a plurality of voltage and current measurements.

The invention notably relates to a method for determining the resistance of at least one accumulator of a battery comprising a statistical study for calculating resistance values during a current pulse. With the statistical study it is possible to validate the retained value of the resistance with great confidence. The method of the invention comprises a step for self-detection of a current pulse conducive to statistical study. The method may thereby be applied when the battery is being used or in maintenance. In the long run, the method of the invention allows a reliable estimation of the state of health (SOH) of the battery.

The invention also relates to a method for determining the capacity of at least one accumulator of a battery comprising a statistical study for calculating SOC values at different instants. With the statistical study, it is possible to validate each retained SOC value with great confidence. The method may be applied when the battery is being used or in maintenance. In the long run, the method of the invention allows a reliable estimation of the state of health (SOH) of the battery.

The method according to the invention may be applied in an electronic management system for a battery comprising means for measuring a current delivered by at least one accumulator of the battery and means for measuring the voltage on the terminals of said at least one accumulator, as well as a microprocessor comprising program means for carrying out the steps which will be described in details below.

The following description is given for an accumulator of a battery. However it is understood that this same description may similarly be applied to a module of a battery, such a module comprising a plurality of accumulators connected in series and/or in parallel in a way known per se; the measured current would then be the one delivered by the module and the measured voltage would be the one measured on the terminals of the module. Likewise the same description may be applied to the battery itself; the measured current would then be the one delivered by the battery and the measured voltage would be the one measured on the terminals of the battery. The decision of determining the resistance on the terminals of the battery, on each module or on each accumulator depends on the application and on the battery type. The electronic management system applying the method according to the invention may also be reprogrammed if need be, if the adequate current and voltage sensors are present in the battery.

First Embodiment

Figure 3:
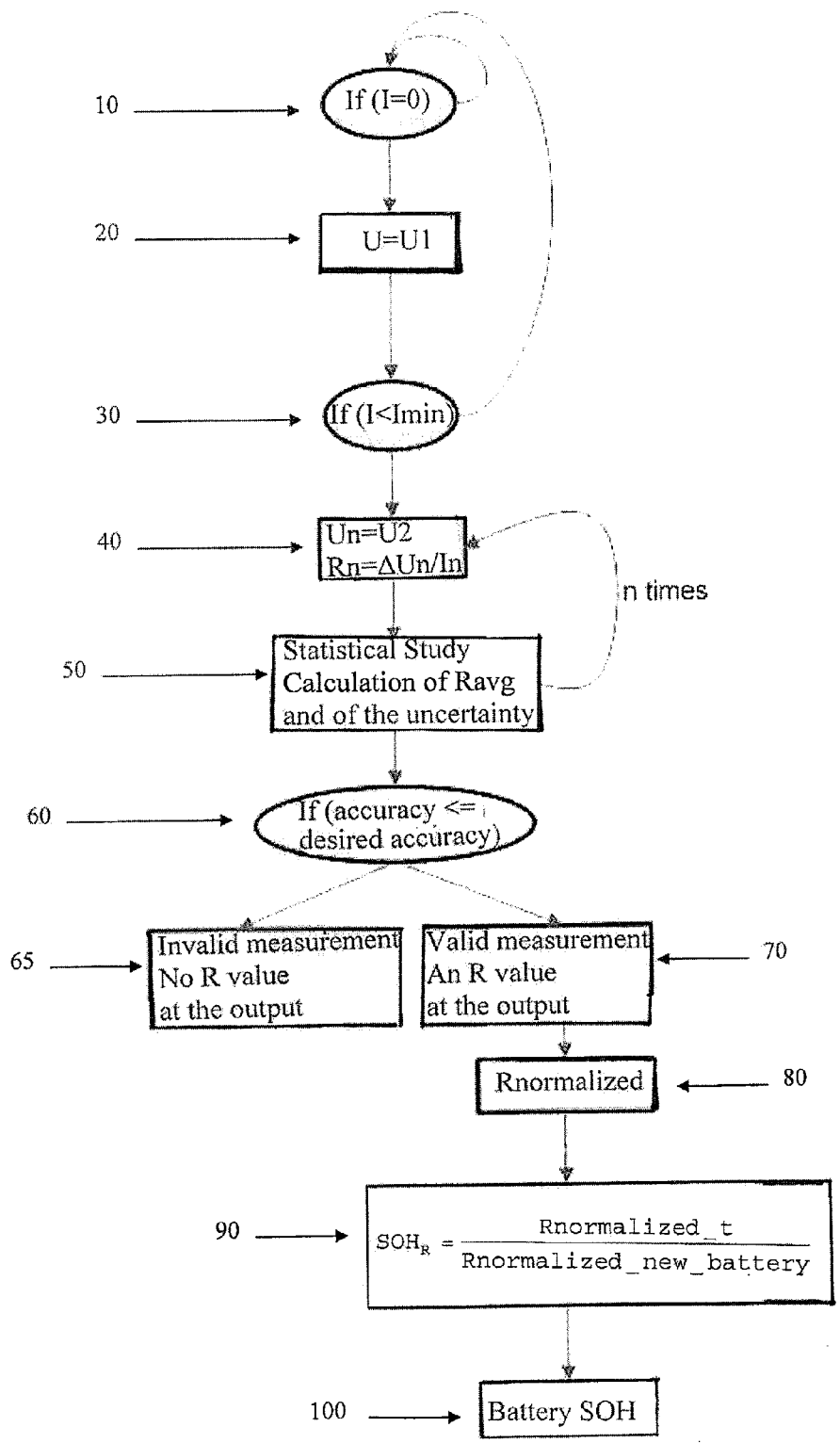

FIG. 3 is a flowchart of the method for determining the SOH according to a first embodiment of the invention, the SOH being determined from the resistance.

In step 10, the current (I) delivered by the accumulator is measured. If the current is zero (I=0), the voltage (U1) on the terminals of the accumulator is measured in step 20. The voltage U1 may either be a single value or an average of values measured during a time interval (about 1 to 2 seconds) when the current is zero, i.e. a statistical study of the measured values using a normal law for example. Otherwise, the measurement of the current is continued until the current delivered by the accumulator is zero. (loop of step 10).

According to an alternative embodiment, in step 10, the voltage U1 may also be measured for a current having a predetermined value I1 (instead of I=0). The values U1, I1 may then be a pair of single values, a pair of averages of measured values during a time interval when the current is substantially equal to I1, or a statistical study of the measured values using a normal law for example.

In step 30, the method detects a current pulse (I<Imin which corresponds to a discharge pulse with Imin<I1; but a charging pulse may also be considered when I>Imin with Imin>I1). The self-determination of a pulse will be described in more detail with reference to the flowchart of FIG. 4.

In step 40, a plurality of voltage and current measurements (Un; In) are carried out on the terminals of the accumulator during said pulse, and a plurality of resistance values of the accumulator (Rn=U1−Un/In) are calculated. Each measurement is conducted independently of the other ones; a sample of resistance values is thereby obtained with a Gaussian distribution of this sample.

In step 50, a statistical study is conducted on the sample of the calculated resistance values. First of all a resistance value is determined, such as the average of the calculated resistance values. In a way known per se, such an average may be expressed as follows:

$$\bar{R} = \frac{1}{n}\sum_{i=1}^{n} R_i$$

With this average is associated a standard deviation ($\sigma$) characterizing the spreading of the distribution of the sample of the calculated resistance values. In a way known per se, the standard deviation is the square root of the variance which may be expressed as follows:

$$s_m^2 = \frac{1}{n(n-1)} \sum_{i=1}^{n} (R_i - \overline{R})^2$$

In step 60, the accuracy of the measurement is evaluated.

An absolute uncertainty on the value of the resistance (ΔR) is first of all determined as the product of the standard deviation and of a Student coefficient ($t_{(vp)}$).

The absolute uncertainty is therefore determined as follows:

$$\Delta R = s_m t_{(vp)}$$

The Student coefficient allows the confidence interval to be defined for a given probability depending on the size of the sample. For example, if a 6σ probability is selected, i.e. 99.7% of the values of the sample are taken into account, the Student coefficient will be equal to 3.376 for a sample of 20 values. FIG. 11 shows a table of the Student coefficients for different probabilities and different sample sizes. The values transferred into this table are known per se.

The absolute uncertainty ΔR therefore depends on the number of resistance measurements conducted during the pulse as well as on the probability with which it is intended to determine the real value in the interval of the measurements. The absolute uncertainty directly depends on the statistical study on the sample of the calculated resistance values.

It is then possible to determine a relative uncertainty as follows: ΔR/R.

If the relative uncertainty is less than or equal to a predetermined accuracy threshold (ΔR/R<S), then the resistance value of the accumulator R may be validated in step 70. The accuracy threshold S may be set well below the uncertainty determined by the conventional method for calculating uncertainties or the method of quadratic deviations. For example, the accuracy threshold may be selected to be less than 10%, for example 5%.

The resistance value R may be provided as soon as the relative uncertainty is less than the threshold even if the current pulse is extended; it may be adjusted, if necessary, gradually during the statistical calculation while the pulse lasts; the resistance value may also be provided only after detecting the end of the pulse, subject to that the relative uncertainty is much less than the threshold.

If the relative uncertainty is greater than the threshold set at the end of the pulse or after having exceeded the number of samples, the resistance measurement of the accumulator R is not validated (step 65). Optionally, the electronic management system applying the method of the invention may include an alarm routine informing the user that a resistance measurement was not able to be established.

In step 80, the determined resistance value R is normalized $R_{norm}$. By normalized resistance is meant the resistance value which would have been determined at a given temperature, for a given current and for a given pulse duration. For example, the resistance is normalized to 25° C., at a current corresponding to discharging conditions and for a pulse duration of 10 seconds. Such normalization is carried out with reference to tables provided by the manufacturer and built up during tests in the laboratory.

In step 90, the state of health (SOH) of the accumulator is then determined as the ratio of the normalized resistance $R_{norm}$ over the resistance of said accumulator in the brand-new condition at the same temperature and at the same current. Generally, manufacturers provide with each sold battery and/or each sold accumulator, a table assigning a resistance value in early life for each temperature-current pair.

In step 100, an indication on the state of health of the battery is provided. The state of health of the battery is determined from the resistance of the battery which may be determined directly according to the method of the invention by voltage and current measurements (Un; In) on the terminals of the battery during said pulse. The resistance of the battery may also be determined as the average of resistances determined on each module or accumulator making up the battery when voltage and current measurements (Un; In) are conducted on the terminals of each module or accumulator during said pulse.

Self-Determination of a Pulse

Figure 4:
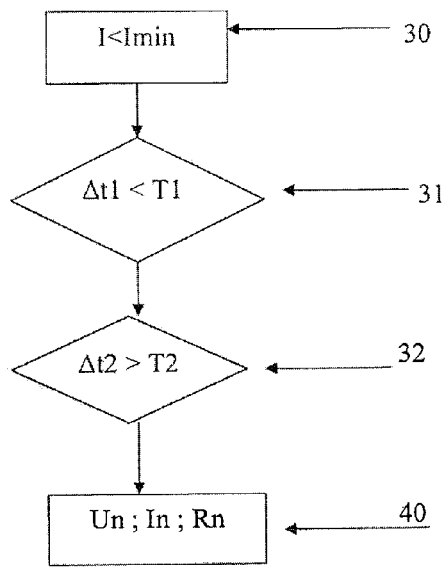
FIG. 4 shows a flow chart of the step for self-determining a pulse in the method according to the first embodiment of the invention.

FIG. 4 is a flowchart of the self-determination of a pulse according to the method of the invention.

In step 30, a current value corresponding to a pulse is detected. The pulse may be negative (during discharge) or positive (during charging). For example, such a current pulse may be detected for I<Imin if Imin<I1 (discharge pulse) or for I>Imin if Imin>I1 (charging pulse). FIG. 4 illustrates the case of a discharge pulse (I<Imin).

In order to allow the statistical study leading to the determination of the resistance of the accumulator, a sample with a sufficient number of measured resistance values should be available. For this purpose, the pulse should have time criteria allowing the measurement (Un; In; Rn) of step 40 described earlier to make up an exploitable sample.

In step 31, a first time interval (Δt1) is determined between a zero current value (I=0) and a current value less than the predetermined threshold (I<Imin). If this first time interval is less than a first threshold (Δt1<T1), then the variation slope is sufficiently significant for having the characteristics of a pulse and notably a sufficient voltage drop in order to allow calculation of resistance.

In step 32, a second time interval (Δt2) is determined while the current remains less than said threshold (I<Imin). If this second time interval is greater than a second threshold (Δt2>T2), then the width of the pulse is sufficient for allowing a sample to be formed with an exploitable size, while being with a stable current, for example a variation ΔI of +/−20% around I. Notably, if the pulse is too short, the sample will be of a small size and the Student coefficient will be high, leading to strong absolute uncertainty and probably to invalidation of the resistance determined by the method of the invention.

The first time threshold (T1), the second time threshold (T2) as well as the current threshold (Imin) may be predetermined or adjusted depending on the temperature of the battery. The electronic management system applying the method of the invention may be programmed with fixed or variable thresholds depending on temperature, according to the applications. The time thresholds (T1, T2) may also depend on the measurement step of the voltage and current sensors. Reprogramming the system is further possible.

If both of these time criteria are met, the method recognizes a pulse which is exploitable for determining a resistance value, whether the battery is being used or in maintenance. A measurement of resistance may thereby be carried out with great reliability, all along the use of the battery. The state of health of the battery may then be regularly determined with great reliability.

Figure 1:
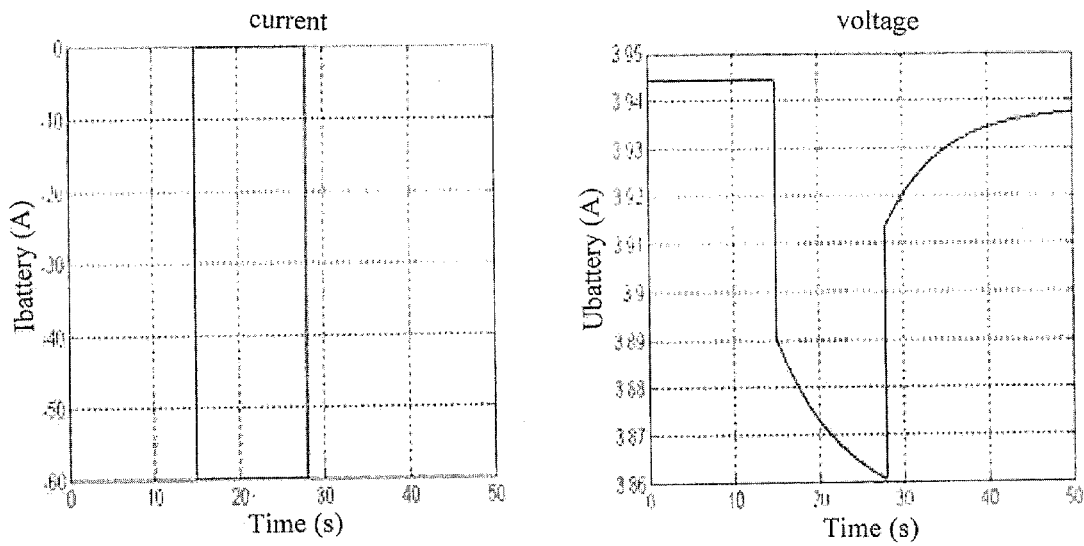
Figure 2:
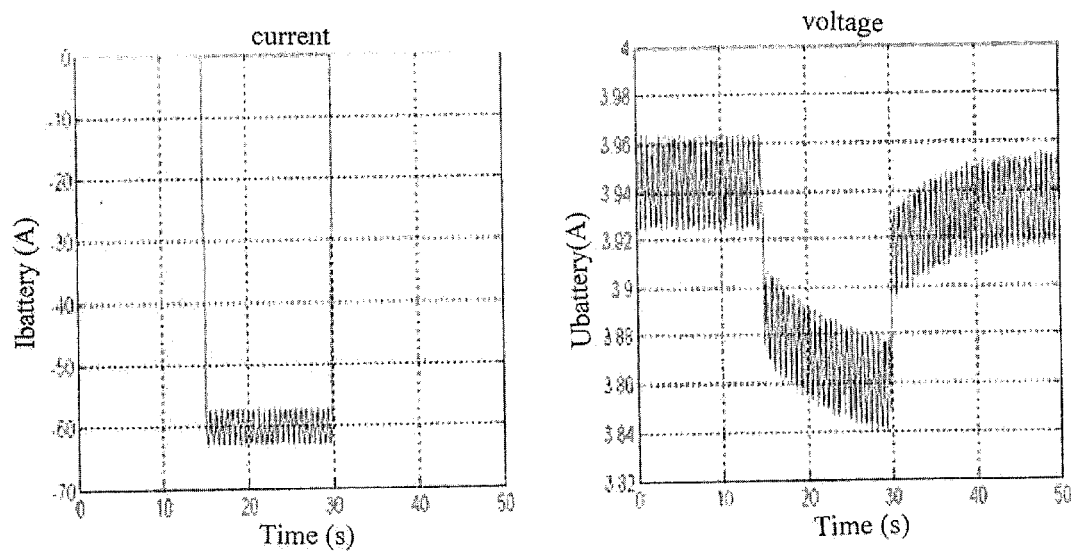
Figure 5:
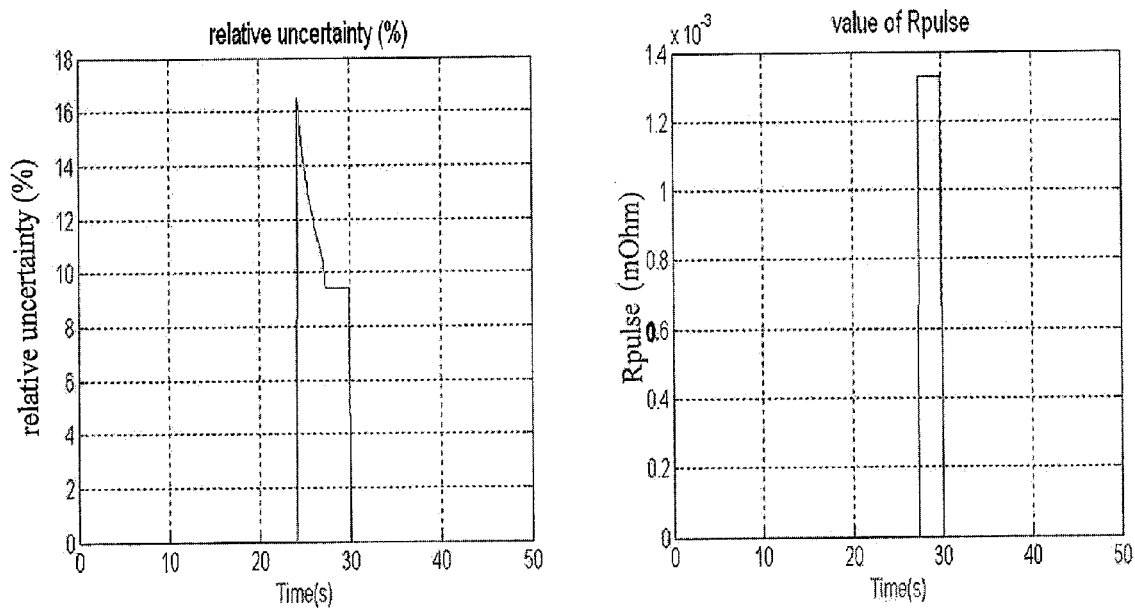
FIG. 5 shows graphs showing the relative uncertainty of the resistance measurement, and the resistance measurement of the battery during a current pulse.

FIG. 5 illustrates the relative uncertainty and the resistance measurement provided by the method of the invention during a current pulse such as the one illustrated in FIG. 2.

It is noted that the measurement begun about 10 seconds after the beginning of the pulse, the threshold T2 then having been reached. It is also noted that the first resistance measurements have strong uncertainty, the size of the statistical sample still being small; and then the uncertainty decreases below the 10% threshold allowing validation of a resistance value R of 1.33 mΩ. Thus, the measurement with the noisy signal conducted by means of the invention actually gives the same value of R as the measurement conducted for an ideal signal without any noise, while guaranteeing an uncertainty on the measurement of less than 10%.

Exemplary Application of the First Embodiment

FIGS. 6 to 10 illustrate an exemplary application of the method according to the invention on a battery comprising four accumulators of the VL30P type in series. Two accumulators were aged and two accumulators were in the brand-new condition for the test. The accumulators were placed in a weathering enclosure and a first series of tests was conducted at 30° C. and a second series of tests was conducted at 0° C. Each test series included two tests. A first test imposed a non-ideal pulse current with a low level of 170 A every 10% of the state of charge by considering accumulators with an SOC of 100% at the beginning of the test; and then after recharging the accumulators, a second test imposed a non-ideal pulse current with a low level of 70 A every 10% of the state of charge. Data acquisition was accomplished every 100 ms and the relative uncertainty threshold S was imposed to be 5%.

Figure 6:
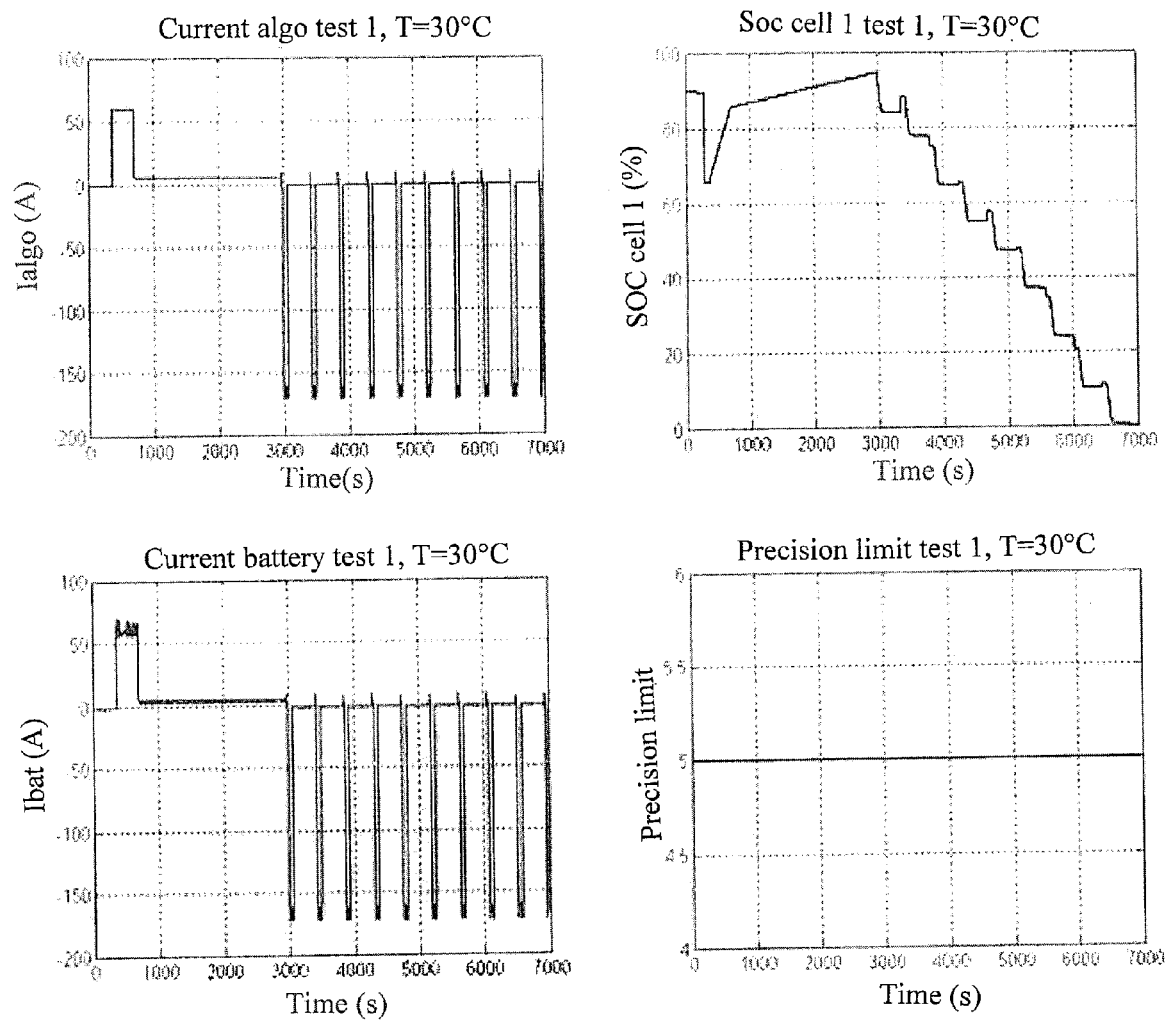
FIG. 6 shows graphs showing the test current applied to a battery, the SOC, the current of the battery and the imposed accuracy limit for an experimental test of the application of the method according to the invention.
Figure 7:
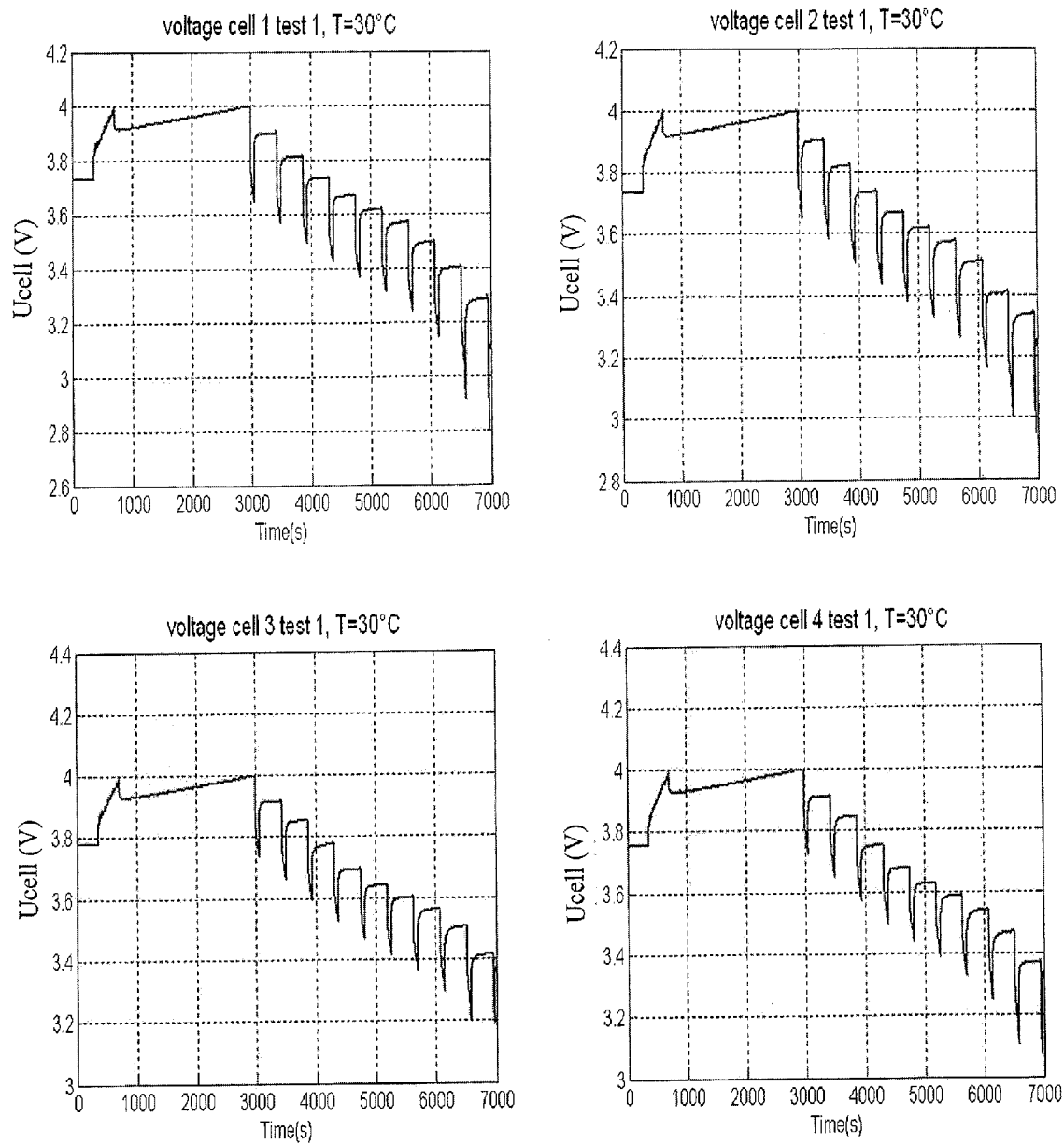
FIG. 7 shows graphs showing the voltages on the terminals of each accumulator of the tested battery.

FIGS. 6 to 10 only show the first test of the first series (30° C. and 170 A). FIG. 6 thus shows the applied test current, the state of charge of the accumulator 1, the current delivered by the battery and the imposed accuracy threshold. FIG. 7 shows the voltages on the terminals of each of the tested accumulators.

Figure 8:
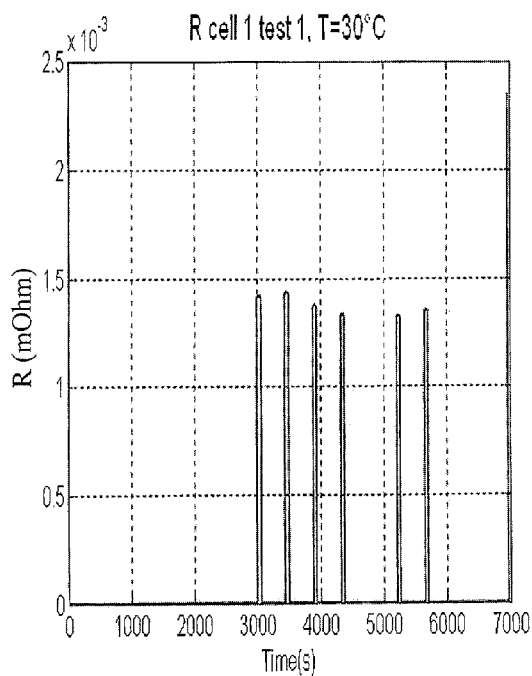
FIG. 8 shows graphs showing the resistances measured on the terminals of each accumulator of the battery tested at each current pulse when the measurement is conducted.
Figure 8:
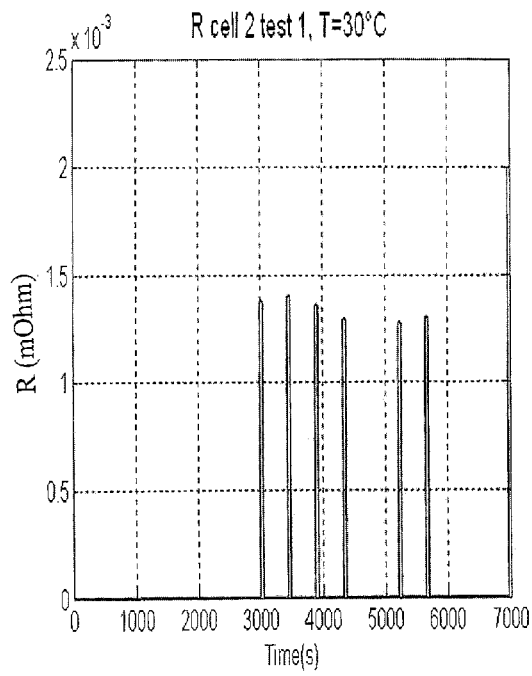
Figure 8:
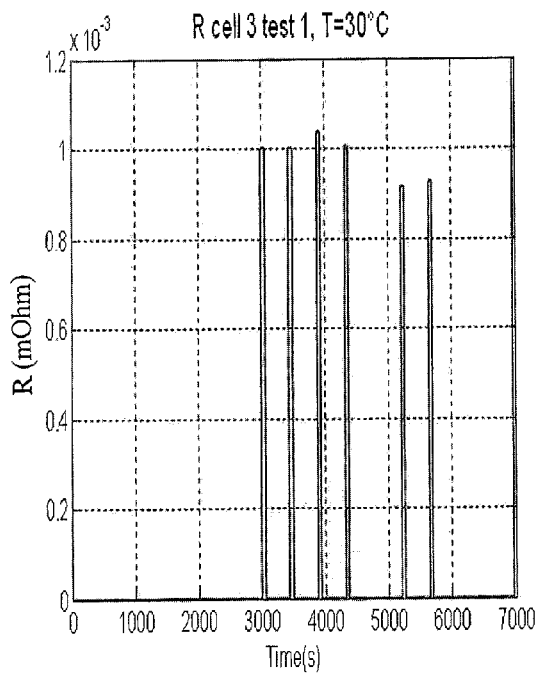
Figure 8:
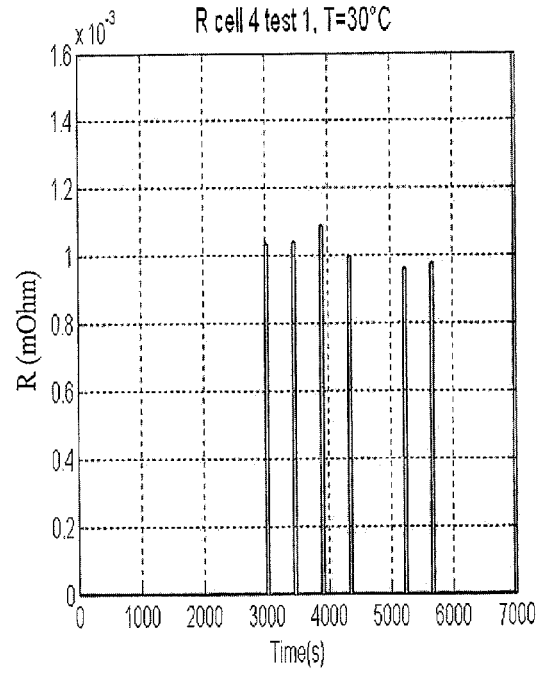
Figure 9:
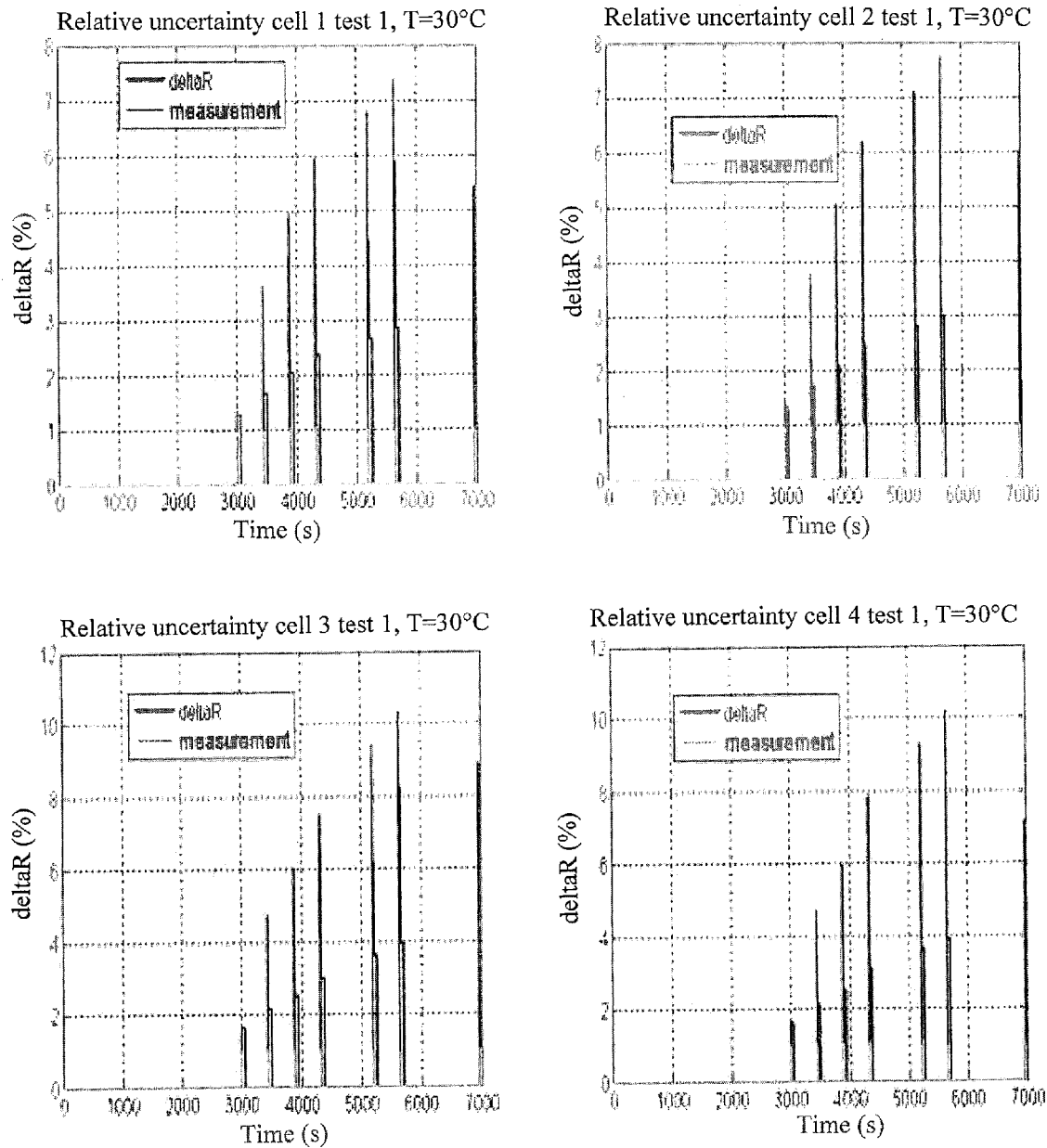
FIG. 9 shows graphs showing the relative uncertainties of the resistance measurements of FIG. 7.

FIGS. 8 and 9 show the resistances and uncertainties determined according to the method of the invention for each accumulator of the battery.

It is noted that certain current pulses did not give rise to a determination of resistance, either the time criteria ($\Delta t1 < T1$; $\Delta t2 > T2$) for detecting a pulse were not met, or the current was outside the stability interval ($\Delta I$).

Figure 10:
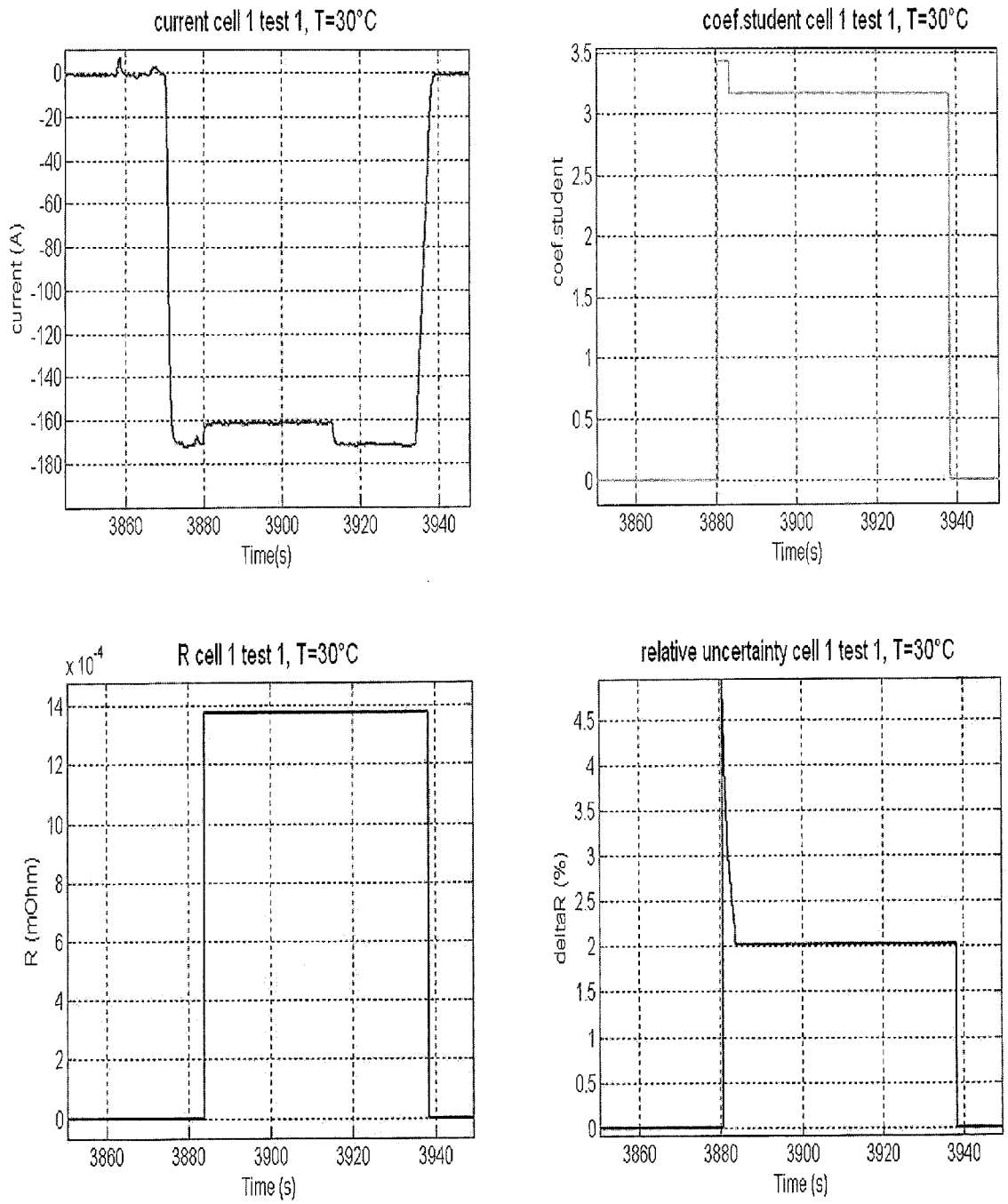
FIG. 10 shows graphs showing enlargements of a test cycle with the delivered current of an accumulator, the Student coefficient for said accumulator, the measured resistance of said accumulator and the uncertainty of said measurement.

FIG. 10 is an enlarged view on a test pulse of FIG. 6. It is noted that the measurement of resistance of the accumulator R is provided with an uncertainty of 2%, i.e. much less than the set threshold of 5%. In this example, the value of resistance is only provided after a given time, even if the accuracy was already reached. It is also noted that the relative uncertainty falls strongly when the Student coefficient decreases, i.e. when the size of the measurement sample increases; therefore it is actually the statistical calculation which allows a reliable resistance value to be provided.

The second test (non-ideal pulse current with a low level of 70 A every 10% of the state of charge) allows validation of the detection thresholds for a pulse (T1, T2, Imin).

The second test series (at 0° C.) allowed validation of the statistical calculation method over a large range and refinement of the detection thresholds for a pulse (T1, T2, Imin), the temperature notably having an influence on the slope of the current pulse.

The conducted tests show that the resistance value determined according to the method of the invention has clearly improved relative uncertainty as compared with the methods of the state of the art. A more reliable determination of SOH and therefore better management of the battery are thus possible.

Second Embodiment

FIG. 13 is a flowchart of the method for determining SOH according to a second embodiment of the invention, the SOH being determined from the capacity.

In step 210, a first plurality of voltage and current measurements (Un; In) on the terminals of the accumulator is carried out when the current is substantially equal to a predetermined value. This first plurality of measurements is designated as a level 1 measurement.

In step 220, a level 1 value of the state of charge is determined according to the statistical method of the invention. This method was described in detail with reference to the statistical calculation of a resistance value. It applies likewise to the calculation of a SOC value at two different charging levels in order to determine a capacity value with limited and known uncertainty.

A plurality of state-of-charge (SOC) values of the accumulator are calculated from voltage and current level 1 measurements. Each value of SOC is calculated from a measured voltage-current pair by referring to the characterization of the measured accumulator (FIG. 12).

Notably, if the level 1 current is substantially zero, a measured voltage value Un will correspond to the no-load voltage $U_0$ of the accumulator and the SOC value will be directly read on the characterization curve. If the level 1 current is not zero, an equivalent no-load voltage value $U_0$ will be determined by $U_0 = Un - RIn$ in order to calculate the value of SOC.

As each voltage and current measurement (Un, In) is conducted independently of each other, it is possible to calculate a plurality of state-of-charge (SOC) values independent of each other; a sample of level 1 SOC values is thus obtained with a Gaussian distribution of this sample.

The level 1 SOC may either be a single value or an average of measured values, or a statistical study.

The level 1 SOC determined according to a statistical study may be calculated as follows.

An SOC1 value is determined as the average of calculated level 1 values of SOC. In a way known per se, such an average may be expressed as follows:

$$\overline{SOC1} = \frac{1}{n}\sum_{i=1}^{n} SOC1_i$$

With this average is associated a standard deviation ($\sigma$) characterizing the spreading of the distribution of the sample of calculated SOC values of level 1. In a way known per se, the standard deviation is the square root of the variance which may be expressed as follows:

$$s_m^2 = \frac{1}{n(n-1)}\sum_{i=1}^{n}(SOC1_i - \overline{SOC1})^2$$

An absolute uncertainty on the value of the level 1 state of charge ($\Delta SOC1$) may then be determined as the product of the standard deviation and of a Student coefficient ($t_{(vp)}$), similarly to what was already described with reference to the statistical calculation of the resistance. A relative uncertainty is then determined as $\Delta SOC1/SOC1$. The absolute uncertainty on SOC is only calculated if the offset on the voltage measurements is substantially zero. Indeed, such a statistical study of the SOC would not give the possibility of suppressing a systematic error of the voltage measurement sensor. The electronic management system applying the invention may include calibration components with which a substantially zero offset may be guaranteed on the voltage measurements.

If this relative uncertainty is less than or equal to a predetermined accuracy threshold, then the value of the state of charge of level 1 of the accumulator SOC1 may be validated (passing to step 215). The accuracy level may be set well below the uncertainty determined by the conventional method for calculating uncertainties or the method of quadratic deviations. For example, the accuracy threshold may be selected to be less than 10%, for example 5%.

An SOC value may be provided as soon as the relative uncertainty is less than the threshold. According to one alternative, the statistical calculation may continue over a given duration and the SOC value may be adjusted if necessary, gradually during the statistical calculation.

If the relative uncertainty is greater than the set threshold at the end of a given measurement duration or after exceeding the number of samples, the SOC measurement of the accumulator is not validated (return to step 210).

In step 215, a second plurality of voltage and current measurements (Un; In) on the terminals of the accumulator is carried out. This second plurality of measurements is designated as a measurement of level 2. The currents for the measurements of level 2 may have a zero or non-zero predetermined value, equal to the predetermined value of the measurements of level 1 or different therefrom.

In step 230, it is checked that the level 2 conditions are sufficiently distinct from the level 1 conditions in order to allow exploitation of the SOC values for calculating a capacity. For example it is checked that one or a few first voltage-current pair measurements of level 2 provide a first SOC value of level 2 different by at least 10% from the already validated SOC1 value of level 1. If the level 2 conditions are too close to the level 1 conditions, the capacity may be marred by a systematic error which the statistical calculation cannot avoid. Step 215 is then repeated until acceptable conditions are met for carrying out determination of SOC at a level 2 and therefore of the capacity.

In step 240, a value of a state of charge of level 2 is determined according to the statistical method of the invention. Step 240 is in every point similar to step 220 and a detailed description thereof will not be repeated. Notably, a value SOC2 is determined as the average of SOC values of level 2 calculated from measured voltage-current pairs at level 2; an absolute uncertainty ΔSOC2 is determined as the product of the standard deviation on the sample of level 2 and of a Student coefficient; and then a relative uncertainty is determined ΔSOC2/SOC2. If this relative uncertainty is less than or equal to a predetermined accuracy threshold, then the value of the state of charge of level 2 of the accumulator SOC2 may be validated.

In step 250, a capacity value may be calculated from the two values of SOC determined and validated according to the statistical method of the invention. More specifically, the capacity may be calculated according to the relationship:

$$C = \frac{\int_{t1}^{t2} I dt / 3600}{SOC2 - SOC1}$$

with SOC1 and SOC2 being the values of the state of charge of the accumulator, determined and validated in steps 220 and 240.

If the value of SOC at level 1 is a single value or a simple average of measured values, the SOC value of level 2 will mandatorily be from a statistical study as described above.

In step 260, the accuracy of the thereby determined capacity value is estimated. An accuracy threshold is attached to each of the SOC values; it is then possible to determine the accuracy threshold of the capacity value by applying the worst case or a quadratic deviation to the SOC accuracy thresholds. If the accuracy threshold set for the capacity value is observed, the measurement of the capacity accumulator is validated (step 270). If the accuracy threshold set for the capacity value is exceeded, the measurement of the capacity of the accumulator is not validated (step 265). The whole of the steps 210 to 260 may be repeated. Optionally, the electronic management system applying the method of the invention may include an alarm routine informing the user that a capacity measurement was not able to be established if the validation is consecutively rejected several times.

In step 280, the determined capacity value C is normalized $C_{norm}$. By normalized capacity is meant the capacity value which would have been determined at a given temperature and for a given current. For example, the capacity is normalized at 25° C., at a current corresponding to discharge conditions C. Such normalization is carried out with reference to tables provided by the manufacturer and built up during tests in a laboratory.

In step 290, the state of health (SOH) of the accumulator is then determined as the ratio of the normalized capacity $C_{norm}$ over the capacity of said accumulator in the brand-new condition at the same temperature and at the same current. Generally, the manufacturers provide with each sold battery and/or each sold accumulator, a table assigning a capacity value in early life for each temperature-current pair.

In step 200, an indication on the state of health on the battery is provided. The state of health of the battery is determined from the capacity of the battery which may be directly determined according to the method of the invention by voltage and current measurements (Un; In) on the terminals of the battery at two different charging levels. The capacity of the battery may also be determined as the average or the minimum of the determined capacities of each module or accumulator making up the battery when the voltage and current measurements (Un; In) are carried out on the terminals of each module or accumulator at different charging levels 1 and 2.

Alternative of the Second Embodiment

From a single SOC value of level 1 and from a plurality of calculated SOC values of level 2 from measured voltage-current pairs at level 2, it is also possible to directly calculate a capacity by a statistical study.

Actually, each SOC2 value calculated from a measured voltage-current pair at level 2, may be used for determining a capacity value $$C_i = \frac{\int_{t1}^{t2} I dt / 3600}{SOC2_i - SOC1}$$

An average capacity is then calculated with:

$$\overline{C} = \frac{1}{n} \sum_{i=1}^{n} C_i$$

With this average is associated a standard deviation (σ) characterizing the spreading of the distribution of the sample of calculated capacity values. In a way known per se, the standard deviation is the square root of the variance which may be expressed as follows:

$$s_m^2 = \frac{1}{n(n-1)} \sum_{i=1}^{n} (C_i - \overline{C})^2$$

An absolute uncertainty on the value of the capacity (ΔC) may then be determined as the product of the standard deviation and of a Student coefficient ($t_{(vp)}$), similarly to what was already described with reference to the statistical calculation of the resistance or of the SOC. A relative uncertainty is then determined as ΔC/C. This uncertainty is independent of the voltage offset because of the difference between two SOC measurements.

The first and second embodiments may be combined. Notably, the electronic system for managing the battery may apply a method for determining the resistance as described with reference to FIG. 3 and use this thereby determined resistance value when it determines an SOC value for a voltage with a non-zero current. The battery management electronic system may also determine the state of health SOH by a statistical determination of the resistance and in parallel or alternatively by a statistical determination of the capacity.

Of course, the present invention is not limited to the embodiments described earlier as an example. The tests shown for validating the method for measuring the resistance and for determining SOH were only provided as an example. The method according to the invention may notably be applied to batteries consisting of any type of electrochemical accumulators without any limitation to lithium ion, lithium polymer, alkaline, supercapacity and hybrid supercapacity accumulators. Further, the number of accumulators connected in series and/or in parallel may vary without this substantially modifying the application of the method according to the invention. Also, the given numerical examples related to threshold values (S, Imin, T1, T2 . . . ) may be modified according to the applications.

The invention claimed is:

1. A computer-implemented method for determining a parameter of at least one accumulator of a battery, the computer implemented method comprising the steps:
conducting a series of voltage and current measurements (Un; In) on the terminals of said at least one accumulator;
calculating, using a microprocessor, a plurality of values of the parameter depending on the voltage and current measurements (Un; In);
determining, using the microprocessor, a value of the parameter as the average of the calculated values of the parameter and an associated standard deviation;
determining, using the microprocessor, an absolute uncertainty on the value of the parameter as the product of the standard deviation and of a Student coefficient related to the number of calculated values of the parameter and to a selected probability;
determining, using the microprocessor, a relative uncertainty on the value of the parameter, the relative uncertainty corresponding to a ratio between the absolute uncertainty and a value of the parameter determined as the average of the calculated values of the parameter;
if the relative uncertainty is less than or equal to a predetermined accuracy threshold, validating the value of the parameter.

2. The computer-implemented method for determining a parameter according to claim 1, wherein said parameter is a resistance of at least one accumulator of a battery, the computer-implemented method comprising the steps:
measuring a current (I) delivered by said at least one accumulator;
measuring a first voltage (U1) on the terminals of said at least one accumulator when the current is substantially equal to a predetermined value (I=I1);
detecting a current pulse;
conducting the plurality of voltage and current measurements (Un; In) of said at least one accumulator during said pulse;
calculating a plurality of resistance values of said at least one accumulator from the first voltage and from the plurality of voltage and current measurements (Rn=|U1−Un|/|I1−In|);
determining a resistance value (R) as the average of the calculated resistance values $$\left( \overline{R} = \frac{1}{n} \sum_{i=1}^{n} R_i \right)$$

and an associated standard deviation ($s_m$);
determining an absolute uncertainty on the value of the resistance (ΔR) as the product of the standard deviation and of a Student coefficient ($t_{(vp)}$) related to the number of calculated resistance values and to a selected probability (ΔR=$s_m t_{(vp)}$);
determining a relative uncertainty on the value of the resistance (ΔR/R);
if the relative uncertainty is less than or equal to a predetermined accuracy threshold (ΔR/R<S), validating the resistance value (R) of said at least one accumulator.

3. The computer-implemented method for determining a parameter according to claim 2, wherein the detection of a current pulse comprises the steps:
determining a first time interval (Δt1) between a current value equal to the predetermined value and a pulse current value;
determining a second time interval (Δt2) during which the current corresponds to a pulse current;
if the first time interval is less than a first threshold (Δt1<T1) and if the second time interval is greater than a second threshold (Δt2>T2), carrying out the voltage and current measurements (Un; In).

4. The computer-implemented method for determining a parameter according to claim 3, wherein the detection of a current pulse further comprises the step of determining whether the pulse current remains in a stability interval (ΔI) during the second time interval (Δt2).

5. The computer-implemented method for determining a parameter according to claim 3, wherein the first time threshold (T1), the second time threshold (T2) and the current threshold (Imin) are adjusted according to the temperature of the battery.

6. The computer-implemented method for determining the resistance according to claim 2, wherein the predetermined value (I=I1) of the current for conducting the first voltage measurement (U1) is substantially equal to zero.

7. The computer-implemented method for determining a parameter according to claim 1, wherein said parameter is a stage-of-charge value of at least one accumulator of a battery, the computer-implemented method comprising the steps:
conducting the plurality of voltage and current measurements (Un; In) on the terminals of said at least one accumulator when the current is substantially equal to a predetermined value (I=I1);

calculating a plurality of state-of-charge values (SOCn) from the plurality of voltage and current measurements (Un; In);

determining a state-of-charge value (SOC) as the average of the plurality of calculated state-of-charge values $$\left(\overline{SOC} = \frac{1}{n}\sum_{i=1}^{n} SOC_i\right)$$

and an associated standard deviation ($s_m$);

determining an absolute uncertainty on the state-of-charge value (ΔSOC) as the product of the standard deviation and of a Student coefficient ($t_{(vp)}$) related to the number of calculated state-of-charge values and to a selected probability (ΔSOC=$s_m t_{(vp)}$);

determining a relative uncertainty on the state-of-charge value (ΔSOC/SOC);

if the relative uncertainty is less than or equal to a predetermined accuracy threshold (ΔSOC/SOC<S), validating the state-of-charge value (SOC).

8. The computer-implemented method for determining a parameter according to claim 7, further comprising the steps:

determining a first state-of-charge value (SOC1) for a first plurality of voltage and current measurements (U1n; I1n) on the terminals of said at least one accumulator;

determining a second state-of-charge value (SOC2) for a second plurality of voltage and current measurements (U2n; I2n) on the terminals of said at least one accumulator;

calculating the capacity of said at least one accumulator from the first and second state-of-charge values as:

$$C = \frac{\int_{t1}^{t2} I dt / 3600}{SOC2 - SOC1}.$$

9. The computer-implemented method for determining a parameter according to claim 1, wherein said parameter is a capacity value of at least one accumulator of a battery, computer-implemented method comprising the steps:

determining a first state-of-charge value (SOC1) of said at least one accumulator;

conducting the plurality of voltage and current measurements (Un; In) on the terminals of said at least one accumulator;

calculating a plurality of second state-of-charge values (SOC2n) from the plurality of voltage and current measurements (Un; In);

calculating a plurality of capacity values from the first and second state-of-charge values as:

$$C_n = \frac{\int_{t1}^{t2} I dt / 3600}{SOC2_n - SOC1};$$

determining a capacity value (C) as the average of the calculated capacity values $$\left(\overline{C} = \frac{1}{n}\sum_{i=1}^{n} C_i\right)$$

and an associated standard deviation ($s_m$);

determining an absolute uncertainty on the value of the capacity (ΔC) as the product of the standard deviation and of a Student coefficient ($t_{(vp)}$) related to the number of calculated capacity values and to a selected probability (ΔC=$s_m t_{(vp)}$);

determining a relative uncertainty on the value of the capacity (ΔC/C);

if the relative uncertainty is less than or equal to a predetermined accuracy threshold (ΔC/C<S), validating the capacity value (C) of said at least one accumulator.

10. The computer-implemented method for determining a parameter according to claim 8, wherein the second state-of-charge value(s) (SOC2) is(are) used for calculating the capacity (C) when they differ by at least 10% from the first state-of-charge value (SOC1).

11. The computer-implemented method for determining a parameter according to claim 1, wherein the Student coefficient is selected for a probability of 99.7%.

12. The computer-implemented method for determining a parameter according to claim 1, wherein the accuracy threshold (S) is less than or equal to 10%.

13. The computer-implemented method for determining a parameter according to claim 1, wherein the accuracy threshold (S) is 5%.

14. The computer-implemented method for determining a parameter according to claim 1, wherein the battery comprises a plurality of accumulators connected in series and/or in parallel and wherein the parameter is determined for each accumulator of the battery, the plurality of voltage and current measurements (Un; In) being conducted on the terminals of each accumulator.

15. The computer-implemented method for determining a parameter according to claim 1, wherein the battery comprises a plurality of modules connected in series and/or in parallel, each module comprising a plurality of accumulators, and wherein the parameter is determined for each module of the battery, the plurality of voltage and current measurements (Un; In) being conducted on the terminals of each module.

16. The computer-implemented method for determining a parameter according to claim 1, wherein the parameter is determined for the battery, the plurality of voltage and current measurements (Un; In) being conducted on the terminals of the battery.

17. A computer-implemented method for determining the state of health (SOH) of at least one accumulator of a battery, comprising the steps:

determining a capacity (C) according to claim 8;
normalizing the determined capacity value;
determining the state of health (SOH) of said at least one accumulator of the battery as the ratio of the normalized determined capacity over the capacity of said at least one accumulator in the brand-new condition.

18. The computer-implemented method for determining the state of health (SOH) according to claim 17, wherein the determined resistance (R) or the determined capacity (C) is normalized at 25° C. and at a current corresponding to discharge conditions.

19. An electronic management system for a battery comprising:

means for measuring a current delivered by at least one accumulator of the battery;

means for measuring the voltage on the terminals of said at least one accumulator;

a microprocessor comprising program means for carrying out the steps of claim 1.

20. A battery comprising a plurality of electrochemical accumulators arranged in modules and/or connected in series and/or in parallel and at least one electronic management system according to claim 19.

21. A module comprising a plurality of electrochemical accumulators connected in series and/or in parallel and at least one electronic management system according to claim 19.

22. An electrochemical accumulator and at least one electronic management system according to claim 19.

* * * * *

UNITED STATES PATENT AND TRADEMARK OFFICE
CERTIFICATE OF CORRECTION

PATENT NO. : 8,775,106 B2  
APPLICATION NO. : 13/186077  
DATED : July 8, 2014  
INVENTOR(S) : Ali Zenati et al.

Page 1 of 1

It is certified that error appears in the above-identified patent and that said Letters Patent is hereby corrected as shown below:

Title Page (73) Assignee: delete "Universite de Lorraine, Nancy Cedex (FR)" and insert --SAFT GROUPE SA, Bagnolet (FR); UNIVERSITE DÉ LORRAINE, Nancy Cedex (FR)--

Signed and Sealed this  
Twenty-seventh Day of January, 2015

Michelle K. Lee  
*Deputy Director of the United States Patent and Trademark Office*